(12) United States Patent
Sera (10) Patent No.: US 9,552,996 B2
(45) Date of Patent: Jan. 24, 2017

(54) SEMICONDUCTOR DEVICE, HAVING CONDUCTIVE PATTERN AND ELECTRONIC APPARATUS

(71) Applicant: SEIKO EPSON CORPORATION, Tokyo (JP)

(72) Inventor: Hiroshi Sera, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/790,178

(22) Filed: Jul. 2, 2015

(65) Prior Publication Data

US 2016/0013072 A1    Jan. 14, 2016

(30) Foreign Application Priority Data

Jul. 10, 2014 (JP) ................. 2014-142024

(51) Int. Cl.
| | | |
|---|---|---|
| *H01L 23/48* | (2006.01) | |
| *H01L 21/3213* | (2006.01) | |
| *H01L 23/532* | (2006.01) | |
| *G02F 1/1368* | (2006.01) | |

(52) U.S. Cl.
CPC ... *H01L 21/32135* (2013.01); *H01L 23/53219* (2013.01); *H01L 23/53223* (2013.01); *G02F 2001/13685* (2013.01); *H01L 2924/0002* (2013.01)

(58) Field of Classification Search
CPC ................. H01L 21/32051; H01L 21/32135; H01L 23/53219; H01L 23/53223
USPC ............................ 257/751, 59, 72, 412, 413
See application file for complete search history.

(56) References Cited

U.S. PATENT DOCUMENTS

| | | | |
|---|---|---|---|
| 6,376,861 B1 * | 4/2002 | Yaegashi | H01L 21/28008 257/350 |
| 2002/0176032 A1 | 11/2002 | Maeda et al. | |
| 2006/0001791 A1 * | 1/2006 | Hwang | G02F 1/1345 349/46 |

FOREIGN PATENT DOCUMENTS

| | | |
|---|---|---|
| JP | 2004-119923 A | 4/2004 |
| JP | 2010-141082 A | 6/2010 |
| JP | 2011-040593 A | 2/2011 |
| JP | 2012-103698 A | 5/2012 |

* cited by examiner

*Primary Examiner* — Hung Vu
(74) *Attorney, Agent, or Firm* — Global IP Counselors, LLP (57) ABSTRACT

There is provided a conductive pattern forming method that can suppress shape abnormalities caused by the reattachment of a neodymium component. A conductive pattern forming method according to an aspect of the invention includes forming an aluminum-neodymium alloy film on a base material; forming, on the aluminum-neodymium alloy film, a conductive film having a thickness greater than or equal to ¼ times the thickness of the aluminum-neodymium alloy film; and patterning the aluminum-neodymium alloy film and the conductive film by using dry etching.

7 Claims, 7 Drawing Sheets

SEMICONDUCTOR DEVICE, HAVING CONDUCTIVE PATTERN AND ELECTRONIC APPARATUS

BACKGROUND

1. Technical Field

This application claims a priority to Japanese Patent Applications No. 2014-142024 filed on Jul. 10, 2014 which is hereby expressly incorporated by reference in its entirety.

Several aspects of the present invention relates to a conductive pattern forming method, a semiconductor device, and an electronic apparatus.

2. Related Art

For example, a structure using an aluminum-neodymium alloy (AlNd alloy) as a metal layer of a laminated interconnect has been proposed as described in JP A-2012-103698.

SUMMARY

To form the above-described laminated interconnect including a metal layer formed of an AlNd alloy by patterning, wet etching has been often used. However, wet etching has the problem that an AlNd alloy film is more susceptible to etching than the other conductive layers, making it difficult to form a laminated interconnect.

On the other hand, in the case of using dry etching, the neodymium component of the AlNd alloy film tends to reattach to the etching surface because of its low vapor pressure. This has lead to the problem that the formed interconnect pattern tends to have an abnormal shape, resulting in a reduction in the yield in the production of a semiconductor device or the like using a laminated interconnect.

An advantage of some aspects of the present invention is to be able to provide a conductive pattern forming method that can suppress shape abnormalities caused by the reattachment of the neodymium component, a semiconductor device including a conductive pattern formed by such a conductive pattern forming method, and an electronic apparatus including such a semiconductor device.

A conductive pattern forming method according to an aspect of the invention includes forming an aluminum-neodymium alloy film on a base material; forming, on the aluminum-neodymium alloy film, a conductive film having a thickness greater than or equal to ¼ times a thickness of the aluminum-neodymium alloy film; and patterning the aluminum-neodymium alloy film and the conductive film by using dry etching.

With this method, it is possible to prevent an abnormality caused as a result of the reattachment of the neodymium component of the aluminum-neodymium alloy film etched in the patterning to the etching surface.

Preferably, the conductive film is made of titanium or titanium nitride.

With this method, it is possible to facilitate the formation of the conductive film.

Preferably, the method includes, prior to forming the aluminum-neodymium alloy film, forming a second conductive film on the base material, wherein, in forming the aluminum-neodymium alloy film, the aluminum-neodymium alloy film is formed on the second conductive film.

With this method, it is possible to suppress the diffusion of the aluminum-neodymium alloy film into the base material.

Preferably, the second conductive film is made of titanium.

With this method, it is possible to further suppress the diffusion of the aluminum-neodymium alloy film into the base material.

A semiconductor device according to an aspect of the invention preferably includes a conductive pattern formed by using the above-described conductive pattern forming method.

Since this configuration includes the conductive pattern formed by using the above-described conductive pattern forming method, it is possible to achieve a semiconductor device that can suppress a reduction in yield.

A semiconductor device according to an aspect of the invention includes an aluminum-neodymium alloy film; and a conductive film that is laminated on the aluminum-neodymium alloy film and has a thickness greater than or equal to ¼ times the thickness of the aluminum-neodymium alloy film.

Since this configuration allows the above-described conductive pattern forming method to be selected as a conductive pattern forming method, it is possible to achieve a semiconductor device that can suppress a reduction in yield.

Preferably, the conductive pattern constitutes at least one of a gate line and a source line.

This configuration can prevent at least one of the gate line and the source line from having an abnormal shape, and therefore, it is possible to prevent short circuiting of a interconnect laminated on the gate line or the source line.

An electronic apparatus according to an aspect of the invention includes the above-described semiconductor device.

With this configuration, it is possible to suppress a reduction in yield.

DESCRIPTION OF EXEMPLARY EMBODIMENTS

Hereinafter, a conductive pattern forming method, a semiconductor device, and an electronic apparatus according to embodiments of the invention will be described with reference to the accompanying drawings. Note that the scope of the invention is not limited to the following embodiments, and various modifications may be made within the scope of the technical idea of the invention. In the drawings, to which a reference is made hereinafter, the scale, the number of components, and the like may be shown differently from those of an actual structure to facilitate understanding of the various components.

Semiconductor Device

In the present embodiment, a description will be given of a liquid crystal device as an example of the semiconductor device.

Figure 1:
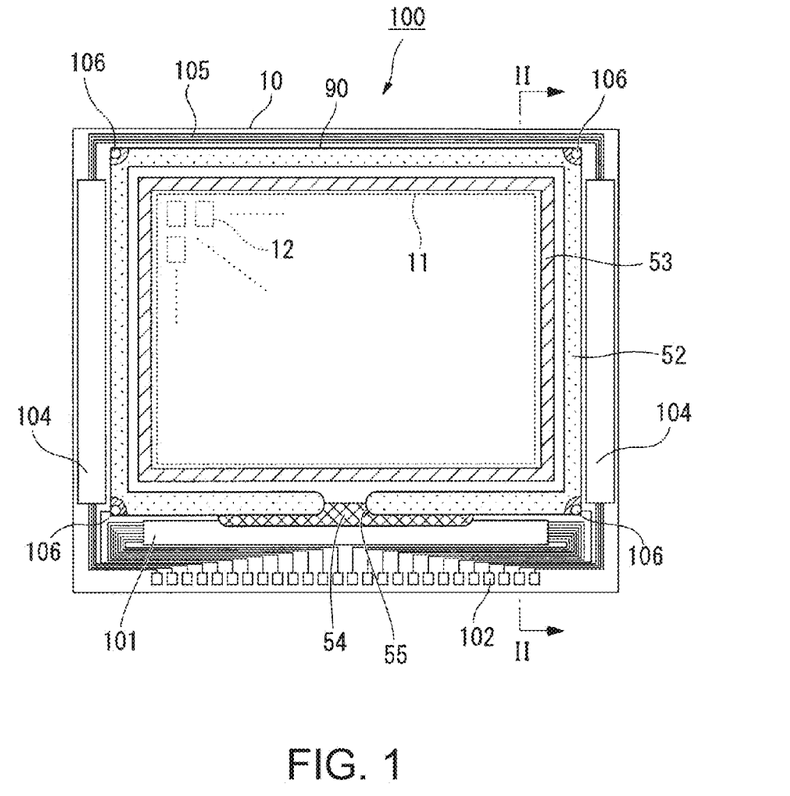
FIG. 1 is a plan view showing a liquid crystal device according to an embodiment of the invention.
Figure 2:
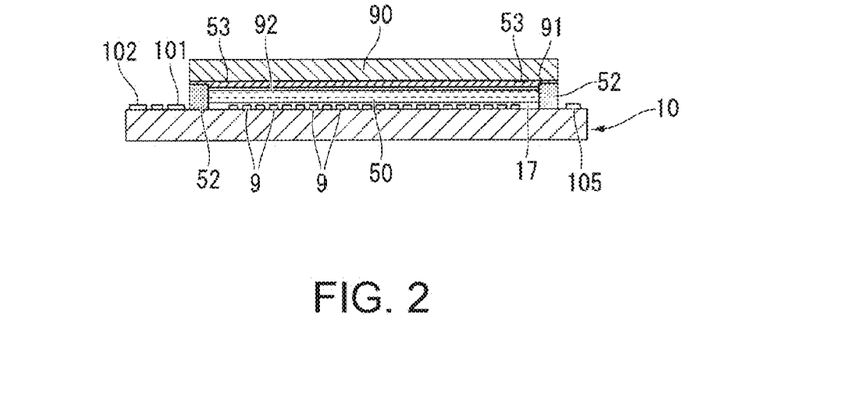
FIG. 2 is a cross-sectional view showing the liquid crystal device according to the embodiment, taken along the arrows II-II in FIG. 1.

FIG. 1 is a plan view showing an example of the schematic configuration of a liquid crystal device 100 according to the present embodiment. FIG. 2 is a cross-sectional view taken along the arrows II-II in FIG. 1. As an example, the liquid crystal device 100 according to the present embodiment is a liquid crystal device in a VA (Vertical Alignment) mode. The liquid crystal device 100 is, for example, a transmissive liquid crystal device.

As shown in FIGS. 1 and 2, the liquid crystal device 100 includes an element substrate 10 and an opposing substrate 90. The element substrate 10 and the opposing substrate 90 are attached together via a seal member 52 having a substantially rectangular frame shape in plan view. An opening 55 for injecting a liquid crystal is formed in the seal member 52. The opening 55 is sealed with a sealant 54. A liquid crystal layer 50 is encapsulated in the region surrounded by the seal member 52 and the sealant 54. A frame 53 having a substantially rectangular frame shape in plan view is formed along the inner peripheral side of the seal member 52 and the sealant 54, and the inner region of the frame 53 serves as an image display region 11. Note that in the following description, the outer region of the image display region 11 is referred to as a peripheral region.

On the inside of the image display region 11, a plurality of pixels 12 are provided in a matrix configuration. Each pixel 12 constitutes the smallest display unit of the image display region 11. In the region outside the seal member 52, a data line drive circuit 101 and an external circuit mounting terminal 102 are formed along one side (the lower side in FIG. 1) of the element substrate 10, and, along each of the two sides adjacent to this side, a scanning line drive circuit 104 is formed, thus forming a peripheral circuit.

On the remaining side (the upper side in FIG. 1) of the element substrate 10, a plurality of interconnects 105 for connection between the scanning line drive circuits 104 on the opposite sides of the image display region 11 are provided. In addition, an inter-substrate conducting member 106 for establishing electrical conduction between the element substrate 10 and the opposing substrate 90 is provided at each corner of the opposing substrate 90.

Figure 3:
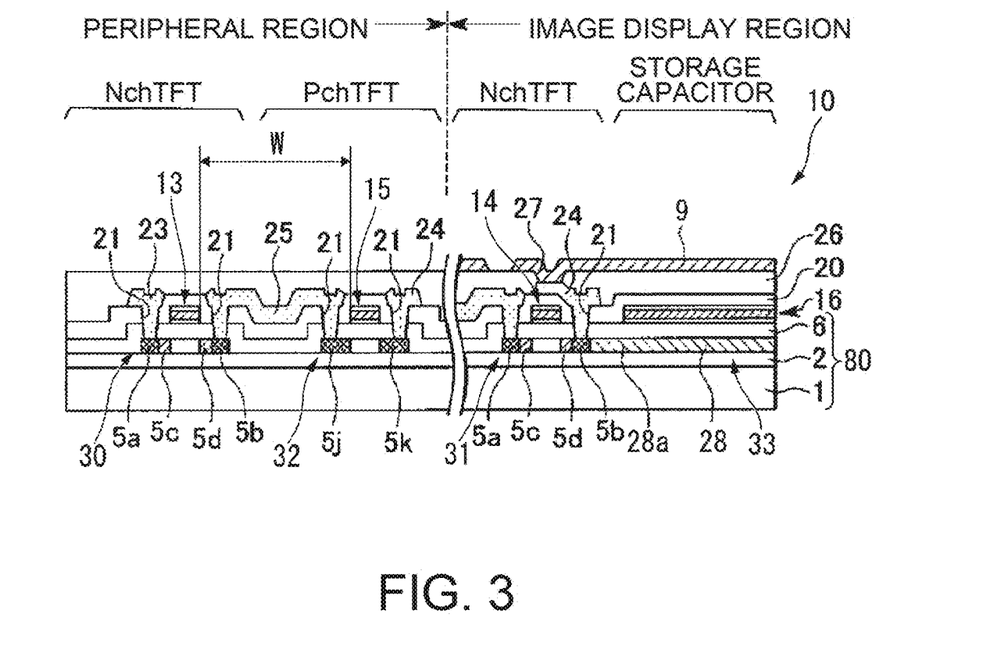
FIG. 3 is a cross-sectional view showing the portion of an element substrate according to the embodiment.

FIG. 3 is an enlarged cross-sectional view of the portion of the element substrate 10. FIG. 3 shows a cross-sectional view of the image display region 11 and the peripheral region. In FIG. 3, the illustration of a first orientation layer 17 has been omitted.

As shown in FIGS. 2 and 3, the element substrate 10 includes a transparent substrate 1, an insulating layer 2, a gate insulating film 6, a plurality of thin film transistors (TFTs), a storage capacitor 33, a first interlayer insulating film 20, a second interlayer insulating film 26, a interconnect 25, a pixel electrode 9, a first orientation layer 17, and a data line (source line) (not shown), a scanning line (gate line) (not shown), and a power supply line (not shown).

As shown in FIG. 3, the transparent substrate 1 is, for example, a support substrate composed of glass or the like.

The insulating layer 2 is formed on the top surface of the transparent substrate 1. The plurality of TFTs are provided on the top surface of the insulating layer 2. In the example shown in FIG. 3, an N-type N channel TFT 30 (Nch TFT) and a P-type P channel TFT 32 (Pch TFT) provided in the peripheral region, and an N-type N channel TFT 31 (Nch TFT) provided in the image display region 11 are provided as the plurality of TFTs.

The N channel TFT 31 provided in the image display region 11 is a switching element provided for each pixel 12. The N channel TFT 31 includes a high-concentration source region 5a, a low-concentration source region 5c, a high-concentration drain region 5b, a low-concentration drain region 5d, a source electrode 23, a drain electrode 24, and a gate electrode (conductive pattern) 14.

The source electrode 23 is connected to the source regions 5a and 5c via a contact hole 21. The drain electrode 24 is connected to the drain regions 5b and 5d via a contact hole 21. The source regions 5a and 5c and the drain regions 5b and 5d are insulated from the gate electrode 14 by the gate insulating film 6.

The source regions 5a and 5c of the N channel TFT 31 are electrically connected to the data line drive circuit 101 via the source electrode 23 and the data line (not shown). The gate electrode 14 of the N channel TFT 31 is electrically connected to the scanning line drive circuit 104 via the scanning line (not shown). The drain regions 5b and 5d of the N channel TFT 31 are electrically connected to the pixel electrode 9 via the drain electrode 24.

Figure 4:
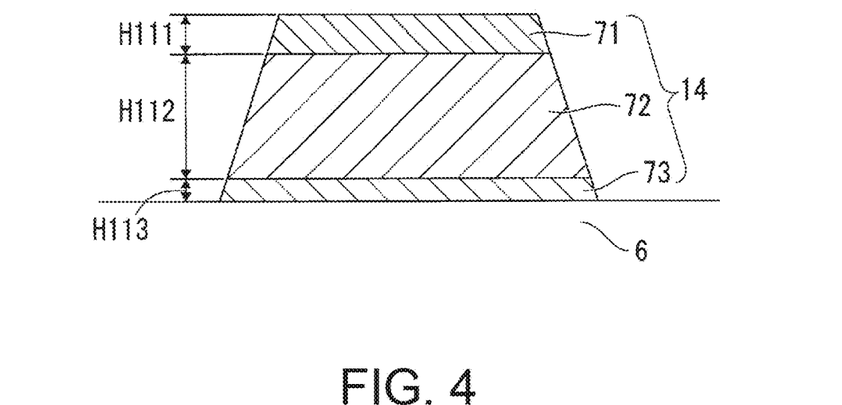
FIG. 4 is a cross-sectional view showing a gate electrode according to the embodiment.

FIG. 4 is a cross-sectional view showing the gate electrode 14 according to the present embodiment. As shown in FIG. 4, the cross-sectional shape of the gate electrode 14 according to the present embodiment is trapezoidal, for example. The gate electrode 14 is formed by a barrier metal film (second conductive film) 73, an AlNd alloy film (aluminum-neodymium alloy film) 72, and a cap metal film (conductive film) 71 that are laminated in this order from the gate insulating film 6 side.

The barrier metal film 73 is a film provided to suppress the diffusion of the material forming the AlNd alloy film 72 into the gate insulating film 6. As the material forming the barrier metal film 73, it is preferable to use titanium (Ti), for example. The reason is that the barrier properties of the barrier metal film 73 can be improved. The thickness H113 of the barrier metal film 73 is about 50 nm or more and 100 nm or less, for example.

The AlNd alloy film 72 is a film formed of an aluminum-neodymium alloy (AlNd) formulated by adding neodymium (Nd) to aluminum (Al). The rate of addition of neodymium (Nd) in atomic percentage is about 0.5 atom % or more and 2 atom % or less, for example.

The cap metal film 71 is a film provided to suppress the occurrence of corrosion and hillock in the AlNd alloy film 72. As the material forming the cap metal film 71, it is possible to select titanium (Ti), titanium nitride (TiN), molybdenum (Mo) or the like, for example. Preferably, the material forming the cap metal film 71 is titanium (Ti) or titanium nitride (TiN). The reason is that titanium (Ti) and titanium nitride (TiN) have a lower melting point than aluminum-neodymium (AlNd), and is easier to handle.

The thickness H111 of the cap metal film 71 is greater than or equal to ¼ times the thickness H112 of the AlNd alloy film 72. Further, the thickness H111 of the cap metal film 71 is, for example, less than or equal to ½ times the thickness H112 of the AlNd alloy film 72.

The thickness H112 of the AlNd alloy film 72 is about 200 nm or more and 400 nm or less, for example. The thickness H111 of the cap metal film 71 is about 50 nm or more and 150 nm or less, for example.

Note that in the present embodiment, the gate electrode 14 is configured integrally with the scanning line (gate line) (not shown). In other words, the scanning line is formed so as to include the gate electrode 14. Also, the source electrode 23 is configured integrally with the data line (source line) (not shown). In other words, the data line is formed so as to include the source electrode 23. The data line and the scanning line are provided so as to be orthogonal to each other in plan view.

The storage capacitor 33 includes a top electrode 16 and a bottom electrode 28. The top electrode 16 is connected to the power supply line (not shown). The bottom electrode 28 is connected to the drain regions 5b and 5d of the N channel TFT 31 via a connection portion 28a.

The N channel TFT 30 and the P channel TFT 32 provided in the peripheral region are TFTs constituting the data line drive circuit 101 and the scanning line drive circuit 104. The N channel TFT 30 includes a high-concentration source region 5a, a low-concentration source region 5c, a high-concentration drain region 5b, a low-concentration drain region 5d, a source electrode 23, a drain electrode 24, and a gate electrode (conductive pattern) 13. The P channel TFT 32 includes a source region 5j, a drain region 5k, a source electrode 23, a drain electrode 24, and a gate electrode (conductive pattern) 15.

The source regions and the drain regions of the N channel TFT 30 and the P channel TFT 32 are electrically connected to the source electrode 23 and the drain electrode 24 as with the N channel TFT 31 provided in the image display region 11. The drain electrode 24 of the N channel TFT 30 and the source electrode 23 of the P channel TFT 32 are electrically connected by the interconnect 25.

The first interlayer insulating film 20 is an insulating film provided on the gate electrodes and the top electrode 16. The second interlayer insulating film 26 is an insulating film provided on the source electrodes, the drain electrodes, and the interconnect 25. The pixel electrode 9 is provided on the second interlayer insulating film 26. A contact hole 27 is formed in the second interlayer insulating film 26. The pixel electrode 9 is electrically connected to the drain electrode 24 via the contact hole 27.

As shown in FIG. 2, the pixel electrode 9 is provided for each pixel 12 on the liquid crystal layer 50 side of the element substrate 10. The pixel electrode 9 is a transparent electrode formed by using a conductive material having a high light transmittance, such as indium tin oxide (ITO). The first orientation layer 17 is formed on the pixel electrode 9.

The frame 53 and a light-shielding film (not shown) are formed on the liquid crystal layer 50 side of the opposing substrate 90. On the frame 53 and the light-shielding film, a common electrode 91 covering the entire surface of the image display region 11 is formed. The common electrode 91 is a transparent electrode formed of, for example, ITO, as with the pixel electrode 9. A second orientation layer 92 is formed on the common electrode 91. The orientation state of the liquid crystal layer 50 in a state in which no electric field is applied to the liquid crystal layer 50 is controlled by the first orientation layer 17 and the second orientation layer 92.

An image signal of an image to be displayed is supplied from the outside of the liquid crystal device 100 to the liquid crystal device 100 via the external circuit mounting terminal 102. Based on image data representing the gray-scale value for each pixel 12 that is contained in the image signal, the data line drive circuit 101 outputs a drive voltage waveform for driving the liquid crystal layer 50 to the N channel TFT 31 serving as the switching element. Based on data representing the display timing of the pixel 12 that is contained in the image signal, the scanning line drive circuit 104 performs on-off control of the N channel TFT 31 by applying a voltage to the gate electrode 14 of the N channel TFT 31.

When the N channel TFT 31 has been turned on, the above-described drive voltage waveform is supplied to the pixel electrode 9, and a voltage is applied to the pixel electrode 9. The potential of the common electrode 91 is held at, for example, a common potential that is common to the plurality of pixels 12. A voltage corresponding to the potential difference between the pixel electrode 9 and the common electrode 91 is applied to the liquid crystal layer 50. An electric field generated by this voltage changes the orientation state of the liquid crystal layer 50. The polarization state of the light that has entered the liquid crystal layer 50 varies for each pixel 12 according to the orientation state of the liquid crystal layer 50. By passing the light exited from the liquid crystal layer 50 through a polarizing plate (not shown), light having a gray-scale value corresponding to the image data is emitted from the polarizing plate. Thus, the liquid crystal device 100 according to the present embodiment can display an image corresponding to the image data.

Next, a manufacturing method of the liquid crystal device 100 according to the present embodiment will be described. FIGS. 5A to 5D and FIGS. 6A to 6D are cross-sectional views showing the procedure of a manufacturing method of the element substrate 10 in the liquid crystal device 100 according to the present embodiment. FIGS. 5A to 5D and FIGS. 6A to 6D show the manufacturing procedure in both the peripheral region and the image display region 11.

Figure 5A:
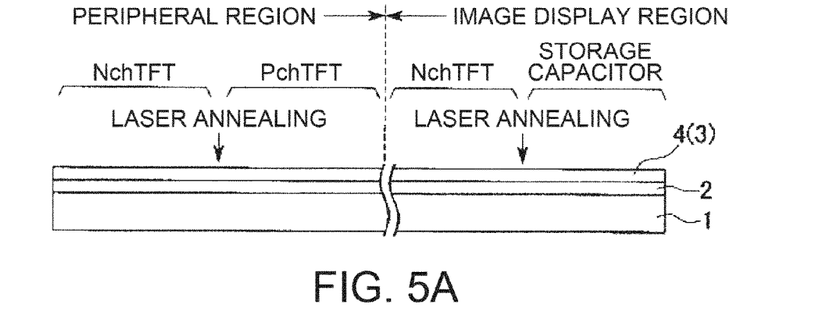
FIGS. 5A to 5D are cross-sectional views each showing a part of the procedure of a manufacturing method of the element substrate according to the embodiment.

First, as shown in FIG. 5A, an insulating layer 2 is formed on the transparent substrate 1, and a semiconductor layer 3 is formed thereon. In the present embodiment, amorphous silicon, for example, is used as the material forming the semiconductor layer. Thereafter, the semiconductor layer 3 formed of amorphous silicon is subjected to a heat treatment such as laser annealing, thereby recrystallizing the amorphous silicon and converting it to polysilicon. Consequently, a semiconductor layer 4 formed of polysilicon is formed.

Figure 5B:
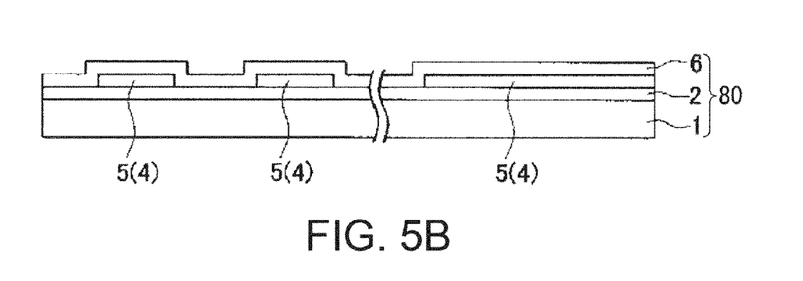

Next, as shown in FIG. 5B, the semiconductor layer 4 formed of polysilicon is patterned into an island-like configuration by using well-known photolithography and etching techniques. Consequently, an island-like semiconductor layer 5 formed of polysilicon is formed.

Next, the gate insulating film 6 is formed, for example, by a CVD (Chemical Vapor Deposition) method or the like on the island-like semiconductor layer 5. Consequently, a laminate member (base material) 80 in which the transparent substrate 1, the insulating layer 2, the semiconductor layer 5, and a gate insulating film 6 are laminated is formed.

Figure 5C:
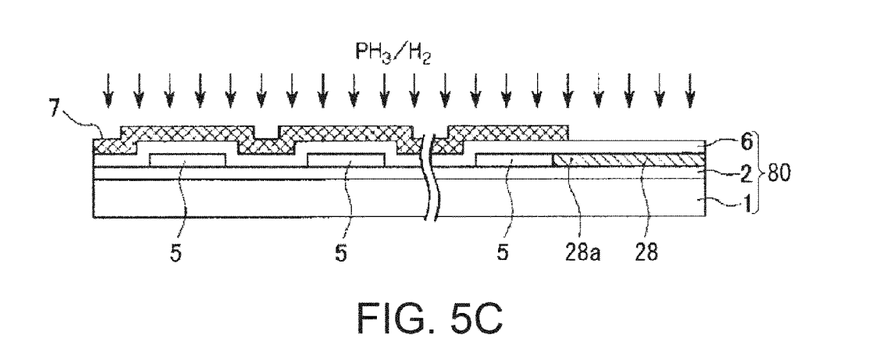

Next, as shown in FIG. 5C, a resist pattern 7 is formed in which, of the image display region 11, a region that will serve as the connection portion 28a between the drain regions 5b and 5d of the N channel TFT 31 and the storage capacitor 33, and a region that will serve as the bottom electrode 28 of the storage capacitor 33 are open. The method of forming the resist pattern 7 is not particularly limited, and it is possible to use photolithography, for example. At this time, the entire surface of the peripheral region is covered by the resist pattern 7.

Next, for example, N-type impurity ions such as $PH_3/H_2$ ions are implanted via the gate insulating film 6 into the semiconductor layer 5 in the regions that will serve as the connection portion 28a and the bottom electrode 28. Consequently, the connection portion 28a and the bottom electrode 28 of the storage capacitor 33 are formed. Thereafter, the resist pattern 7 is removed.

Figure 5D:
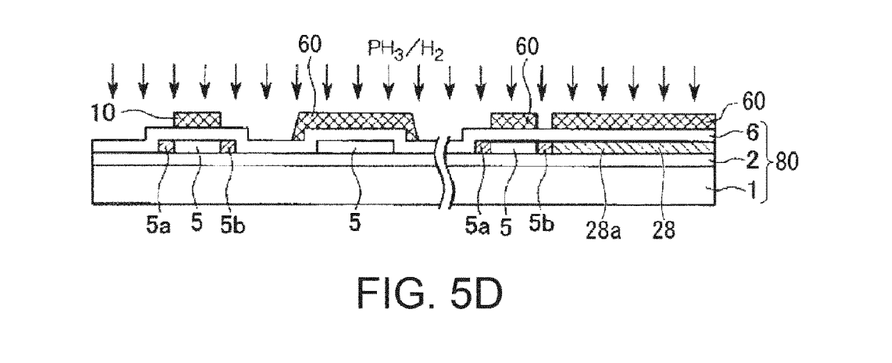

Next, as shown in FIG. 5D, a resist pattern 60 is formed in which portions of the image display region 11 that will serve as the high-concentration source region 5a and the high-concentration drain region 5b of the N channel TFT 31 and portions of the peripheral region that will serve as the high-concentration source region 5a and the high-concentration drain region 5b of the N channel TFT 30 are open. The method of forming the resist pattern 60 is not particularly limited, and it is possible to use the same method as that used for the resist pattern 7 described above, for example.

Next, for example, N-type impurity ions such as $PH_3/H_2$ ions are implanted via the gate insulating film 6 into the semiconductor layer 5 in the portions that will serve as the high-concentration source regions 5a and the high-concentration drain regions 5b of the N channel TFTs 31 and 30. Consequently, the high-concentration source regions 5a and the high-concentration drain regions 5b of the N channel TFTs 31 and 30 are formed. Thereafter, the resist pattern 60 is removed.

Conductive Pattern Forming Method

Next, as shown in FIG. 6A to 6D, the gate electrodes 13, 14, and 15 of the TFTs and the top electrode 16 of the storage capacitor 33 are formed on the gate insulating film 6. Hereinafter, an electrode forming method according to the present embodiment will be described in detail. Note that the electrode forming method described below corresponds to the conductive pattern forming method recited in the claims.

Figure 7:
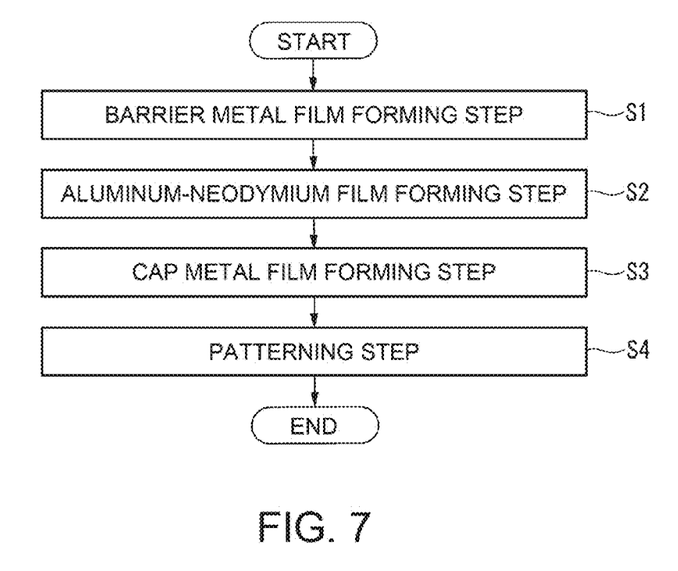
FIG. 7 is a flowchart showing an electrode forming method according to an embodiment of the invention.

FIG. 7 is a flowchart showing the procedure of the electrode forming method according to the present embodiment. As shown in FIG. 7, the electrode forming method according to the present embodiment includes a barrier metal film forming step S1, an aluminum-neodymium alloy film forming step S2, a cap metal film forming step S3, and a patterning step S4.

Figure 6A:
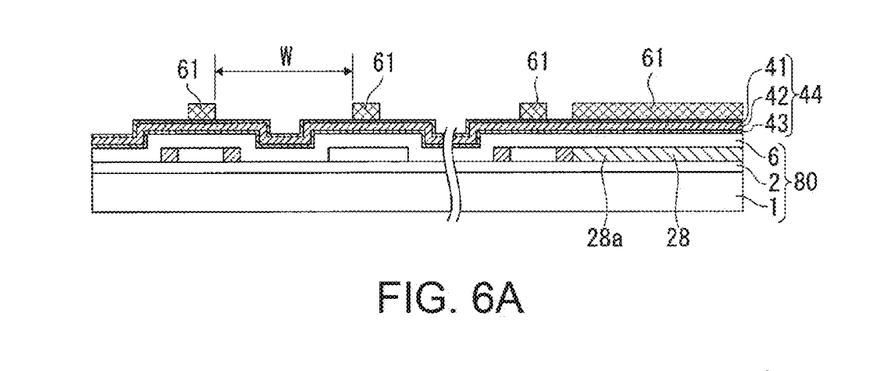
FIGS. 6A to 6D are cross-sectional views each showing a part of the procedure of a manufacturing method of the element substrate according to the embodiment.

First, the barrier metal film forming step S1 is a step of forming a barrier metal film (second conductive film) 43 on the laminate member 80, more specifically, on the gate insulating film 6 of the laminate member 80. The method of forming the barrier metal film 43 is not particularly limited, and it is possible to use, for example, a sputtering method or a CVD method. For example, titanium (Ti) is used as the material forming the barrier metal film 43 in the present embodiment. By this step, the barrier metal film 43 is formed on the laminate member 80 as shown in FIG. 6A.

Next, the aluminum-neodymium alloy film forming step S2 is a step of forming an AlNd alloy film 42 on the barrier metal film 43. The method of forming the AlNd alloy film 42 is not particularly limited, and it is possible to use the same forming method as that used for the barrier metal film 43, for example. By this step, the AlNd alloy film 42 laminated on the barrier metal film 43 is formed.

Next, the cap metal film forming step S3 is a step of forming a cap metal film 41 on the AlNd alloy film 42. The method of forming the cap metal film 41 is not particularly limited, and it is possible to use the same forming method as that used for the barrier metal film 43, for example. For example, titanium nitride (TiN) is used as the material forming the cap metal film 41.

In the cap metal film forming step S3, the cap metal film 41 is formed so as to have a thickness greater than or equal to ¼ times the thickness of the AlNd alloy film 42. That is, the cap metal film 41 having a thickness greater than or equal to ¼ times the thickness of the AlNd alloy film 42 is formed on the AlNd alloy film 42. By this step, a laminate film 44 in which the barrier metal film 43, the AlNd alloy film 42, and the cap metal film 41 are laminated is formed on the gate insulating film 6.

Figure 6B:
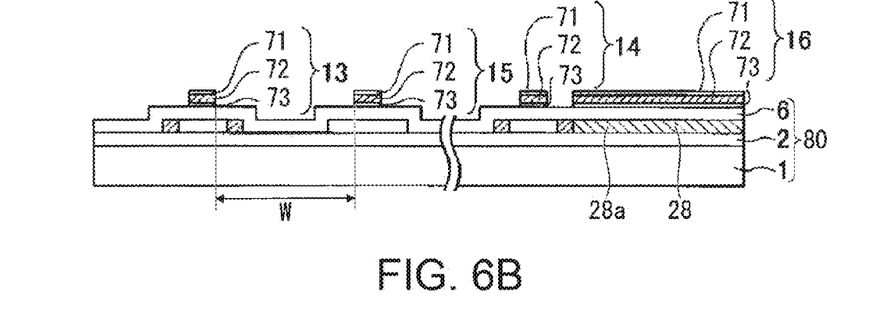

Next, the patterning step S4 is a step of patterning, by using dry etching, the laminate film 44 in which the barrier metal film 43, the AlNd alloy film 42, and the cap metal film 41 are laminated.

On the cap metal film 41, a resist pattern 61 is formed in which the regions that will serve as the gate electrodes of the TFTs and the top electrode of the storage capacitor are open. Then, the laminate film 44 is patterned by dry etching. There is no particular limitation with respect to dry etching, and it is possible to use any of various plasma systems such as capacitively coupled plasma systems typified by a PE (Plasma Etching) system and an RIE (Reactive Ion Etching) system and high-density plasma systems typified by an ICP (Inductively Coupled Plasma) system.

The etching gas is not particularly limited as long as the laminate film 44 can be etched, and it is possible to use, for example, a gas mixture of chlorine ($Cl_2$) and boron trichloride ($BCl_3$). By this step, the laminate film 44 is patterned. Thereafter, the resist pattern 61 is removed.

Figure 6C:
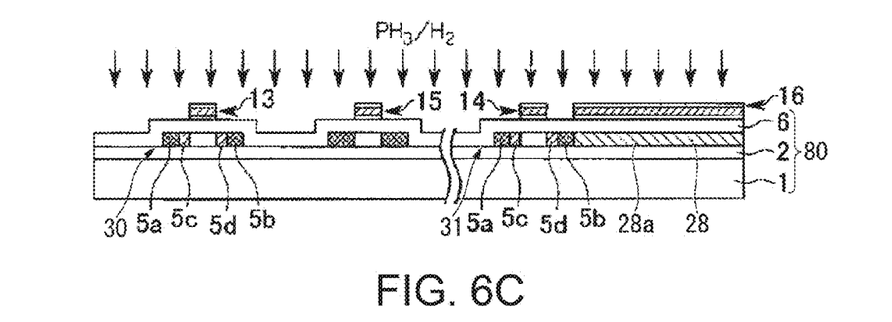
Figure 6D:
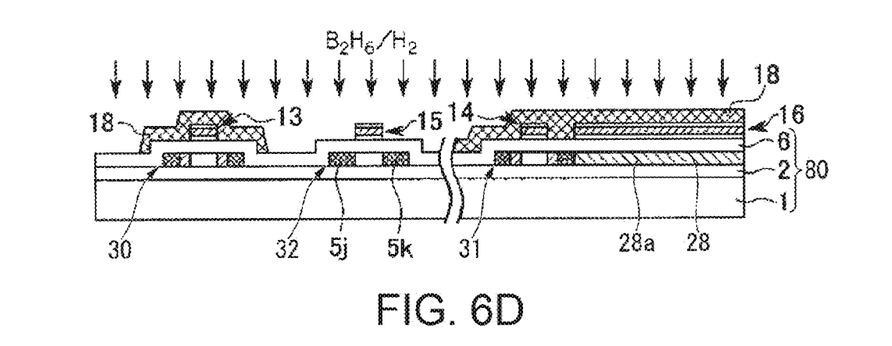

By the above-described steps, the gate electrodes 13 and 14 of the N channel TFTs 30 and 31, the gate electrode 15 of the P channel TFT 32, and the top electrode 16 of the storage capacitor 33 are formed in each of which the barrier metal film 73, the AlNd alloy film 72, and the cap metal film 71 are laminated in this order from the gate insulating film 6 side, as shown in FIG. 6D.

Here, as described above, the gate electrode 14 of the N channel TFT 31 is configured integrally with the scanning line (gate line). That is, the scanning line (gate line) including the gate electrode 14 is formed by the electrode forming method (conductive pattern forming method) according to the present embodiment described above. In other words, the conductive pattern formed by patterning the laminate film 44 constitutes the scanning line (gate line).

Next, as shown in FIG. 6C, for example, N-type impurity ions such as $PH_3/H_2$ ions are implanted in a low concentration into the entire surface of the substrate without the use of a resist pattern. Consequently, the low-concentration source regions 5c and the low-concentration drain regions 5d of the N channel TFTs 30 and 31 are formed. Thereby, the N channel TFTs 30 and 31 are formed.

Note that at this time, the N-type impurity ions are implanted into the P channel TFT 32 since the ion implantation is performed using only the gate electrodes 13, 14, and 15 and the top electrode 16 as masks. However, this will not pose any significant problem because the N-type impurity ions have a low concentration.

Next, as shown in FIG. 6D, a resist pattern 18 is formed in which the region for forming the P channel TFT 32 is open and the regions for forming the N channel TFTs 30 and 31 and the storage capacitor 33 are covered. Then, for example, P-type impurity ions such as $B_2H_6/H_2$ ions are implanted using the resist pattern 18 as a mask. Consequently, the source region 5j and the drain region 5k of the P channel TFT 32 are formed, thus forming the P channel TFT 32. Thereafter, the resist pattern 18 is removed.

Next, as shown in FIG. 3, the first interlayer insulating film 20 is formed, and thereafter, the contact holes 21 passing through the first interlayer insulating film 20 to respectively reach the source regions and the drain regions of the TFTs are formed.

Next, in order to form the data line (source line), the source electrode 23, the drain electrode 24, the interconnect 25 and so forth, a metal film serving as their material, such as an aluminum film, is deposited on the entire surface. Thereafter, the deposited metal film is patterned by using photolithography or the like, thus forming the data line, the source electrode 23, the drain electrode 24, the interconnect 25 and so forth.

Next, a second interlayer insulating film 26 is formed, and thereafter, a contact hole 27 passing through the second interlayer insulating film 26 to reach the drain electrode 24 of the N channel TFT 31 in the image display region 11 is formed.

Next, a transparent conductive film made of ITO or the like is formed on the entire surface, and the film is patterned by using photolithography or the like. Consequently, a pixel electrode 9 that is connected via the drain electrode 24 to the high-concentration drain region 5b of the N channel TFT 31 is formed.

Next, a first orientation layer 17 that is made of polyimide or the like and has been subjected to, for example, rubbing, is formed on the entire surface of the substrate including the pixel electrode 9. By the above-described steps, an element substrate 10 is formed.

Although the illustration of further steps has been omitted, the element substrate 10 and the opposing substrate 90 are attached together, and a liquid crystal is encapsulated between these substrates to form a liquid crystal layer 50, thus producing a liquid crystal device 100 according to the present embodiment.

According to the present embodiment, it is possible to suppress shape abnormalities caused by the reattachment of the neodymium component to the etching surface. This will be described in detail below.

Figure 11:
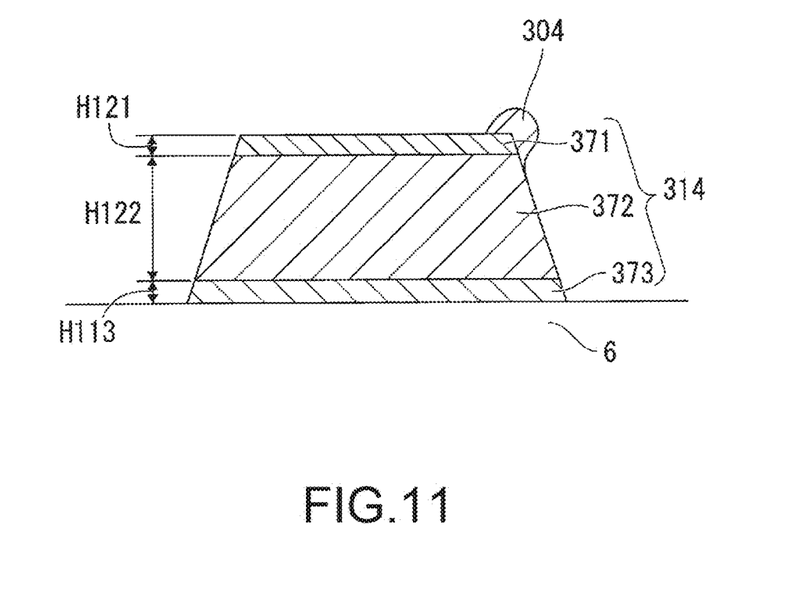
FIG. 11 is a cross-sectional view showing the gate electrode according to the comparative example.

FIG. 11 is a cross-sectional view showing a gate electrode 314 according to a comparative example. As shown in FIG. 11, the gate electrode 314 is formed by a barrier metal film 373, an AlNd alloy film 372, and a cap metal film 371 that are laminated in this order from the gate insulating film 6 side. The thickness H121 of the cap metal film 371 is less than or equal to ¼ times the thickness H122 of the AlNd alloy film 372.

When the thickness H121 of the cap metal film 371 is less than or equal to ¼ times the thickness H122 of the AlNd alloy film 372, the neodymium component of the AlNd alloy film removed by using dry etching in the patterning step S4 described above tends to reattach to the etching surface. This is because the vapor pressure of the neodymium component is relatively low.

When the neodymium component reattaches to the etching surface, a reattachment portion 304 composed of neodymium is formed on the cap metal film 371 and the AlNd alloy film 372. For example, the reattachment portion 304 has a bump-like shape raised upwardly from the top surface of the cap metal film 371, as shown in FIG. 11.

When the top surface of the gate electrode 314 has an abnormal shape such as a partially raised shape due to the reattachment portion 304, the laminate film formed on the gate electrode 314 will also have an abnormal shape. For example, in the case of the above-described liquid crystal device, the data line provided orthogonal to the scanning line in plan view is laminated on the gate electrode (scanning line) 314.

For example, the data line is formed by performing patterning after a metal film made of aluminum (Al) or the like is formed. If the gate electrode 314 has an abnormal shape, the metal film formed on the gate electrode 314 will also have an abnormal shape, for example, a partially raised shape. An etching residue tends to be generated in the base of such a partially raised portion.

The generation of an etching residue may cause a problem such as short-circuiting between data lines formed adjacent to each other, for example. Further, corrosion tends to occur from the etching residue as a starting point. Accordingly, there has been the problem that the reattachment of the neodymium component of the AlNd alloy film to the top surface of the cap metal film results in a reduction in the yield of the produced semiconductor device such as a liquid crystal device.

To address this problem, according to the present embodiment, the thickness H111 of the cap metal film 71 is greater than or equal to ¼ times the thickness H112 of the AlNd alloy film 72. Accordingly, it is possible to suppress a reduction in yield caused by a shape abnormality resulting from the reattachment of the neodymium component to the top surface of the cap metal film 71 in the patterning step S4.

Although the details are unknown, the principle by which the reattachment of the neodymium component to the top surface of the cap metal film 71 can be suppressed is presumably as follows. That is, when the thickness H111 of the cap metal film 71 (cap metal film 41) is greater than or equal to ¼ times the thickness H112 of the AlNd alloy film 72 (AlNd alloy film 42), the thickness H111 of the cap metal film 71 is relatively large as compared with the thickness H112 of the AlNd alloy film 72. Accordingly, the neodymium component contained in the etched AlNd alloy film 42 cannot easily reach the top surface of the cap metal film 71.

Therefore, according to the present embodiment, it is possible to suppress shape abnormalities resulting from the reattachment of the neodymium component to the etching surface, thus preventing the gate electrode 14 formed by the patterning step S4 from having an abnormal shape. As a result, it is possible to suppress a reduction in the yield of the produced semiconductor device such as a liquid crystal device.

From the foregoing, according to the present embodiment, it is possible to mass-produce a interconnect having a laminated structure containing an aluminum-neodymium alloy that is excellent in heat resistance and stability.

For example, the narrower the interval W (see FIGS. 6A and 6B) between electrodes (interconnects) formed by patterning, the more likely the neodymium component reattaches to the top surface of the cap metal film. This is a finding newly clarified by the experiments carried out by the inventors. Although the details of the principle are unknown, it seems that due to a narrow interval of patterning by etching, the etched neodymium component cannot easily escape to the outside and tends to reattach to the top surface of the cap metal film.

The experiments carried out by the inventors have clarified that when the interval W of the electrodes (interconnects) is 10 μm or less, the neodymium component tends to reattach to the top surface of the cap metal film. That is, the electrode (interconnect) forming method according to the present embodiment is particularly useful when the interval of the electrodes (interconnects) to be patterned is 10 μm or less.

Note that the following configurations and methods may be adopted in the present embodiment.

Although the gate electrode 14 has a three-layer laminated structure including the barrier metal film 73, the AlNd alloy film 72, and the cap metal film 71 in the present embodiment, the invention is not limited thereto. In the present embodiment, the gate electrode 14 need not include the barrier metal film 73. In this case, the barrier metal film forming step S1 in the electrode forming method in the present embodiment is omitted.

In the present embodiment, for example, the source electrode 23 of the N channel TFT 31 may be formed by the electrode forming method according to the present embodiment shown in FIG. 7. That is, the conductive pattern formed by the electrode forming method of the present embodiment may constitute the data line (source line) including the source electrode 23. In this case, the gate electrode (the scanning line, the gate line) need not be formed by the electrode forming method of the present embodiment.

Although the above description is given of a liquid crystal device as an example of the semiconductor device to which the invention is applied, the invention is not limited thereto. The present invention can also be applied to an organic electroluminescence device, an electrophoretic display device or the like as a semiconductor device.

For example, for a device in which the aperture ratio is not affected by the layout of TFTs as in the case of a top emission type organic electroluminescence device, it is easy to achieve a higher definition because the number of TFTs and the interval between the interconnects of TFTs can be determined without taking the aperture ratio into consideration. However, in the case of using interconnects that use an aluminum-neodymium alloy of the comparative example as shown in FIG. 11, the yield is reduced as the interval between the interconnects is narrowed, and therefore, there will be some constraints on the number of TFTs and the interval between the interconnects.

In contrast, when the invention is applied to a top emission type organic electroluminescence device, it is possible to suppress a reduction in yield in the case of using laminated interconnects containing an aluminum-neodymium alloy as the interconnects of TFTs even if the interval between the interconnects is set to be narrow. Accordingly, the above-described constraints can be reduced. Thus, the invention is particularly useful for application to a top emission type organic electroluminescence device.

The applicable range of the invention is not limited to a semiconductor device using TFTs, and the invention is also applicable to a semiconductor device using a MOSFET (Metal-Oxide-Semiconductor Field-Effect Transistor), an organic field-effect transistor (OFET), and the like.

Electronic Apparatus

Next, an embodiment of an electronic apparatus will be described. As an example, an electronic apparatus according to the present embodiment is electronic paper including a display device (semiconductor device) to which the invention is applied.

Figure 8:
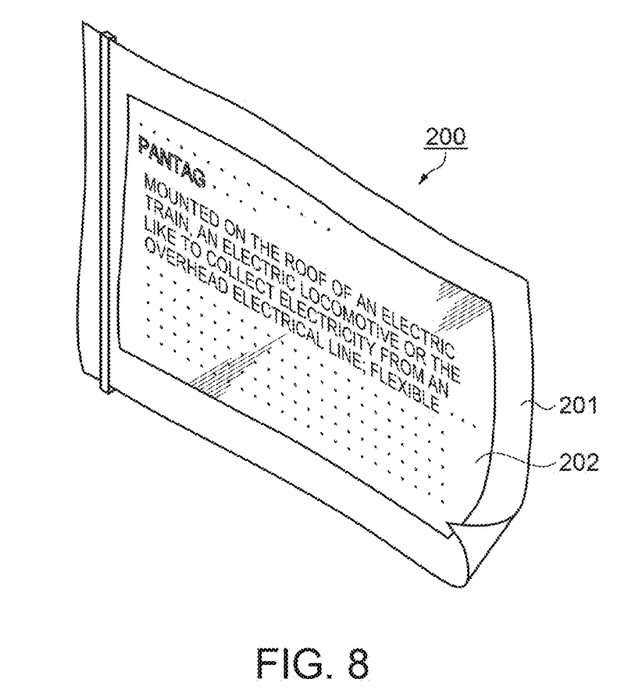
FIG. 8 is a perspective view showing electronic paper according to an embodiment of the invention.

FIG. 8 is a perspective view showing electronic paper 200 according to the present embodiment. As shown in FIG. 8, the electronic paper (electronic apparatus) 200 includes a body portion 201 composed of a rewritable sheet having texture and flexibility that are similar to those of paper, and a display unit 202 composed of a display device (semiconductor device) to which the invention is applied.

In electronic paper as well, the aperture ratio is not directly affected by the arrangement of switching elements as with the above-described top emission type organic electroluminescence device. Accordingly, the invention is particularly useful for application to electronic paper.

Note that the above-described electronic apparatus is merely an example of the electronic apparatus according to the invention, and is not to be construed to limit the technical scope of the invention. The display device (semiconductor device) according to the invention can also be suitably applied, for example, to a display unit or the like of an electronic apparatus such as a mobile phone or a portable audio device.

EXAMPLES

A gate electrode 414 according to an example of the invention was formed by using the electrode forming method (conductive pattern forming method) according to the embodiment described above, and was compared with a gate electrode 514 according to a comparative example.

The gate electrode 414 of the example was formed by forming a laminate film including a barrier metal film with a thickness of 50 nm, an AlNd alloy film with a thickness of 400 nm, and a cap metal film with a thickness of 100 nm, followed by patterning by dry etching.

The gate electrode 514 of the comparative example was formed by forming a laminate film including a barrier metal film with a thickness of 50 nm, an AlNd alloy film with a thickness of 400 nm, and a cap metal film with a thickness of 50 nm, followed by patterning by dry etching.

For both the example and the comparative example, the material forming the barrier metal film was titanium (Ti), and the material forming the cap metal film was titanium nitride (TiN). In addition, the neodymium (Nd) content in the AlNd alloy film was 1 atom %.

Figure 9:
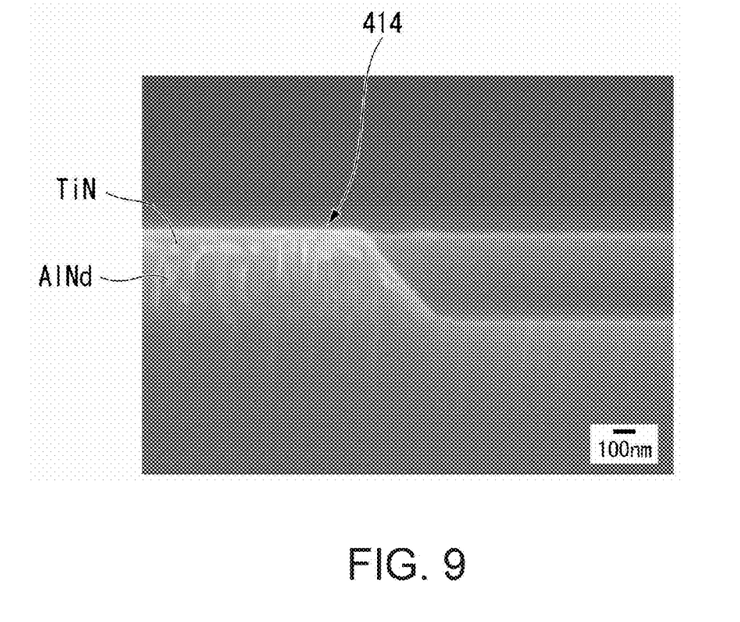
FIG. 9 is an electron micrograph showing a gate electrode according to an example of the invention.
Figure 10:
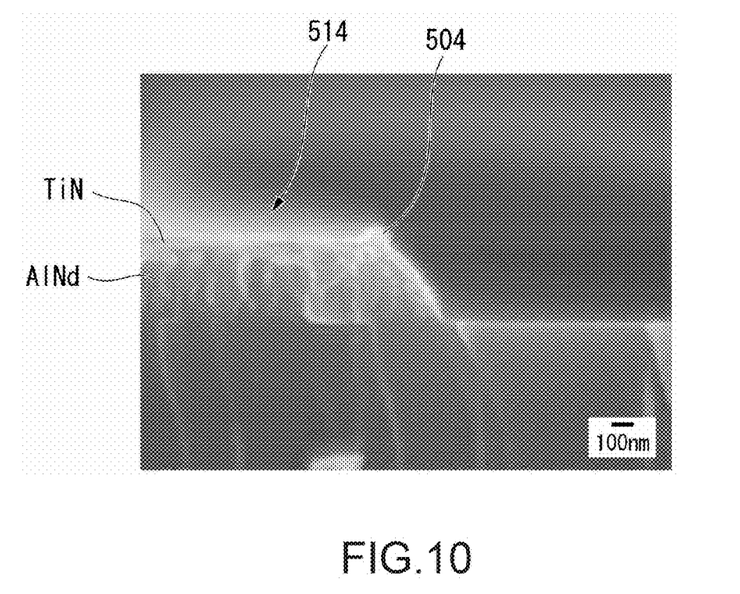
FIG. 10 is an electron micrograph showing a gate electrode according to a comparative example.

As the etching gas used for dry etching, a gas mixture of chlorine ($Cl_2$) and boron trichloride ($BCl_3$) was used. The distance between the electrodes (interconnects) formed by patterning was 10 μm for both the example and the comparative example. The results are shown in FIGS. 9 and 10. FIG. 9 is an electron micrograph showing the gate electrode 414 of the example. FIG. 10 is an electron micrograph showing the gate electrode 514 of the comparative example.

As shown in FIG. 10, it was confirmed that a raised reattachment portion 504 was formed on the top surface of the cap metal film formed of titanium nitride (TiN) in the gate electrode 514 of the comparative example. On the other hand, as shown in FIG. 9, it was confirmed that no reattachment portion was formed on the top surface of the cap metal film in the gate electrode 414 of the example.

From the above-described results, it was confirmed that according to the example, it is possible to prevent the reattachment of the neodymium component to the top surface of the cap metal film during formation of the laminated interconnect containing an aluminum-neodymium alloy, thus preventing the formed electrode (interconnect) from having an abnormal shape.

What is claimed is:

1. A semiconductor device comprising a first gate electrode formed by using a forming method including:
   forming an aluminum-neodymium alloy film on a base material;
   forming, on the aluminum-neodymium alloy film, a conductive film having a thickness greater than or equal to ¼ times a thickness of the aluminum-neodymium alloy film; and
   patterning the aluminum-neodymium alloy film and the conductive film by using dry etching,
   a gap between the first gate electrode and a second gate electrode that is provided adjacent to the first gate electrode being 10 μm or less.

2. An electronic apparatus comprising the semiconductor device according to claim 1.

3. A semiconductor device comprising:
   a first gate electrode including
      an aluminum-neodymium alloy film, and a conductive film that is laminated on the aluminum-neodymium alloy film and has a thickness greater than or equal to ¼ times a thickness of the aluminum-neodymium alloy film;
an insulating film that is provided on the first gate electrode; and
a wiring that is provided on the insulating film,
a gap between the first gate electrode and a second gate electrode that is provided adjacent to the first gate electrode being 10 μm or less.

4. The semiconductor device according to claim 3,
wherein the first gate electrode constitutes at least one of a gate line and a source line.

5. The semiconductor device according to claim 3,
wherein the aluminum-neodymium alloy film is formed on a barrier film, and
the barrier film contains titanium.

6. An electronic apparatus comprising the semiconductor device according to claim 3.

7. A semiconductor device comprising:
a first wiring including
an aluminum-neodymium alloy film, and
a conductive film that is laminated on the aluminum-neodymium alloy film and has a thickness greater than or equal to ¼ times a thickness of the aluminum-neodymium alloy film;
an insulating film that is provided on the first wiring; and
a pixel electrode that is provided on the insulating film,
a gap between the first wiring and a second wiring that is provided adjacent to the first wiring being 10 μm or less.

* * * * *